(12) United States Patent
Yu et al.

(10) Patent No.: US 10,672,647 B2
(45) Date of Patent: Jun. 2, 2020

(54) WAFER LEVEL CHIP SCALE PACKAGING INTERMEDIATE STRUCTURE APPARATUS AND METHOD

(71) Applicant: Taiwan Semiconductor Manufacturing Company, Ltd., Hsinchu (TW)

(72) Inventors: Chen-Hua Yu, Hsinchu (TW); Der-Chyang Yeh, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/049,499

(22) Filed: Jul. 30, 2018

(65) Prior Publication Data

US 2018/0342414 A1    Nov. 29, 2018

Related U.S. Application Data

(62) Division of application No. 14/037,185, filed on Sep. 25, 2013, now Pat. No. 10,269,619.

(Continued)

(51) Int. Cl.
*H01L 21/768* (2006.01)
*H01L 23/31* (2006.01)
(Continued)

(52) U.S. Cl.
CPC ........ *H01L 21/768* (2013.01); *H01L 23/3128* (2013.01); *H01L 23/5383* (2013.01); *H01L 23/5384* (2013.01); *H01L 23/5389* (2013.01); *H01L 24/19* (2013.01); *H01L 21/568* (2013.01); *H01L 23/49816* (2013.01); *H01L 24/81* (2013.01); *H01L 25/105* (2013.01); *H01L 2224/0401* (2013.01); *H01L 2224/04105* (2013.01); *H01L 2224/13099* (2013.01);
(Continued)

(58) Field of Classification Search
CPC .............. H01L 21/768; H01L 23/5384; H01L 2225/1041; H01L 2225/107; H01L 2225/1058
See application file for complete search history.

(56) References Cited

U.S. PATENT DOCUMENTS 6,555,917 B1    4/2003  Heo
7,727,803 B2 *  6/2010  Yamagata ......... H01L 23/49816
                                                     257/701

(Continued)

*Primary Examiner* — David A Zarneke
(74) *Attorney, Agent, or Firm* — Slater Matsil, LLP

(57) ABSTRACT

Presented herein is a WLCSP intermediate structure and method forming the same, the method comprising forming a first redistribution layer (RDL) on a carrier, the first RDL having mounting pads disposed on the first RDL, and mounting interposer dies on a second side of the first RDL. A second RDL is formed over a second side of the interposer dies, the second RDL having a first side adjacent to the interposer dies, one or more lands disposed on the second RDL, at least one of the one or more lands in electrical contact with at least one of the interposer dies or at least one of the mounting pads. A molding compound is formed around the interposer dies and over a portion of the first RDL prior to the forming the second RDL and the second RDL is formed over at least a portion of the molding compound.

18 Claims, 5 Drawing Sheets

Related U.S. Application Data

(60) Provisional application No. 61/788,470, filed on Mar. 15, 2013.

(51) Int. Cl.
*H01L 23/00* (2006.01)
*H01L 23/538* (2006.01)
*H01L 21/56* (2006.01)
*H01L 25/10* (2006.01)
*H05K 3/42* (2006.01)
*H05K 3/46* (2006.01)
*H01L 23/498* (2006.01)

(52) U.S. Cl.
CPC ............ *H01L 2224/14135* (2013.01); *H01L 2224/16238* (2013.01); *H01L 2224/32225* (2013.01); *H01L 2224/73204* (2013.01); *H01L 2224/73253* (2013.01); *H01L 2224/73259* (2013.01); *H01L 2224/81005* (2013.01); *H01L 2224/81191* (2013.01); *H01L 2224/83005* (2013.01); *H01L 2224/83104* (2013.01); *H01L 2224/92125* (2013.01); *H01L 2224/92224* (2013.01); *H01L 2224/96* (2013.01); *H01L 2224/97* (2013.01); *H01L 2225/1023* (2013.01); *H01L 2225/1041* (2013.01); *H01L 2225/1058* (2013.01); *H01L 2924/00014* (2013.01); *H01L 2924/1461* (2013.01); *H01L 2924/15192* (2013.01); *H01L 2924/15311* (2013.01); *H01L 2924/181* (2013.01); *H05K 3/429* (2013.01); *H05K 3/4688* (2013.01); *H05K 2201/09536* (2013.01); *H05K 2203/1316* (2013.01)

(56) References Cited

U.S. PATENT DOCUMENTS

| | | | |
|---|---|---|---|
| 7,923,304 B2 | 4/2011 | Choi et al. | |
| 8,378,477 B2* | 2/2013 | Do | H01L 21/566 |
| | | | 257/685 |
| 8,779,601 B2* | 7/2014 | Gan | H01L 23/48 |
| | | | 257/686 |
| 8,941,222 B2* | 1/2015 | Hunt | H01L 21/565 |
| | | | 257/678 |
| 9,252,065 B2* | 2/2016 | Lin | H01L 25/50 |
| 2011/0147917 A1* | 6/2011 | England | H01L 23/3677 |
| | | | 257/692 |
| 2011/0159639 A1* | 6/2011 | Yee | H01L 21/568 |
| | | | 438/109 |
| 2012/0038053 A1 | 2/2012 | Oh et al. | |
| 2012/0049364 A1* | 3/2012 | Sutardja | H01L 24/24 |
| | | | 257/738 |
| 2012/0061855 A1 | 3/2012 | Do et al. | |
| 2012/0104590 A1 | 5/2012 | Do et al. | |
| 2012/0119373 A1 | 5/2012 | Hunt | |
| 2013/0037936 A1 | 2/2013 | Choi et al. | |
| 2013/0075926 A1 | 3/2013 | Bae et al. | |
| 2013/0105991 A1 | 5/2013 | Gan et al. | |

* cited by examiner

US 10,672,647 B2

WAFER LEVEL CHIP SCALE PACKAGING INTERMEDIATE STRUCTURE APPARATUS AND METHOD

PRIORITY

This application is a divisional of U.S. patent application Ser. No. 14/037,185 filed on Sep. 25, 2013 and entitled "Wafer Level Chip Scale Packaging Intermediate Structure Apparatus and Method", which claims the benefit of U.S. Provisional Application No. 61/788,470, filed on Mar. 15, 2013, entitled "Wafer Level Chip Scale Packaging Intermediate Structure Apparatus and Method," which application is hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also, in some instances, require smaller packages that utilize less area than packages of the past.

Package on package (PoP) technology is becoming increasingly popular for its ability to allow denser integration of integrated circuits into a small overall package. PoP technology is employed in many advanced handheld devices, such as smart phones. While PoP technology has allowed for a lower package profile, the total thickness reduction is currently limited by the solder ball joint height and the distance between adjacent joints, referred to as the pitch. Dies are sometimes mounted to an interposer substrate or other packaging carrier using a conductive mounting structure such as a ball grid array, land grid array, pin array, or the like.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale.

DETAILED DESCRIPTION

The making and using of the presented embodiments are discussed in detail below. It should be appreciated, however, that the present disclosure provides many applicable concepts that can be embodied in a wide variety of specific contexts. The specific embodiments discussed are merely illustrative of specific ways to make and use the described conductive wafer level chip scale package (WLCSP) intermediate structure, and do not limit the scope of the disclosure.

Embodiments will be described with respect to a specific context, namely making and using intermediate structures useful in, for example, WLCSP assemblies. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component.

The embodiments of the present disclosure are described with reference to FIGS. 1 through 10, and variations of the embodiments are also discussed. Throughout the various views and illustrative embodiments of the present disclosure, like reference numbers are used to designate like elements. Additionally, the drawings are intended to be illustrative, are not to scale and not intended to be limiting. Note that, for simplification, not all element numbers are included in each subsequent drawing. Rather, the element numbers most pertinent to the description of each drawing are included in each of the drawings.

A WLCSP structure or package-on-package (PoP) structure may comprise one or more dies, chips, integrated circuits, boards, assemblies, packages or other components bonded to an intermediate structure that provides electrical connectivity between devices. In some intermediate packages, a base layer such as an interposer is used a base to build up one or more redistribution layer (RDL) structures permitting the components to be mounted and to communicate with each other, or with external devices. It has been discovered that one or more components may be disposed in an interposer, with RDL structures formed over the devices to provide electrical connection between the interposer components, components mounted on the intermediate structure, or with an external device. It is believed that such an intermediate structure may provide greater device density and power density while reducing package size and manufacturing costs.

Figure 1:
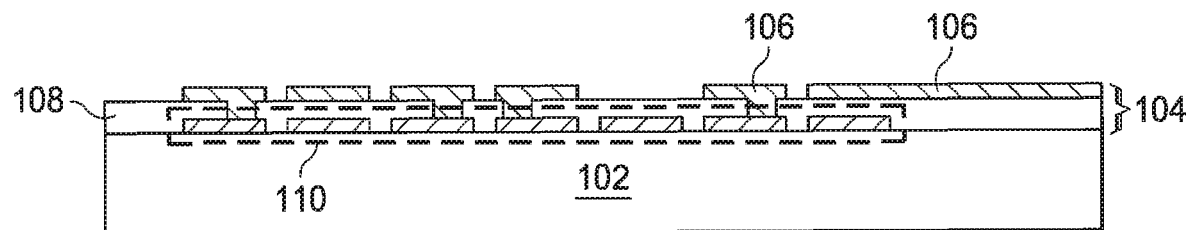
FIGS. 1 through 9 illustrate cross-sectional views of intermediate steps in forming a wafer level chip scale package (WLCSP) intermediate structure according to an embodiment.

FIG. 1 illustrates a cross sectional view of an initial layer of a first RDL 104 according to an embodiment. A first RDL 104 may be formed on a carrier wafer 102. The carrier wafer 102 may be provided to carry or support subsequent layers during formation of the intermediate structure. The carrier wafer 102 is formed from glass, silicon, ceramic, metal or another material and is sufficiently rigid to prevent significant flexing or damage to the intermediate structure during processing. The carrier wafer 102 is, for example, about 12 inches in diameter, but may have a size selected to handle one or more intermediate structures during processing. A laminated attachable film (not shown) such as a die attachment film (DAF) or light-to-heat conversion (LTHC) film may be applied to the surface of the carrier wafer 102 to permit debonding or the carrier wafer during or after processing of the intermediate structure.

The first RDL 104 has one or more mounting pads 110 and/or one or more conductive elements 106 disposed in an initial dielectric layer 108. In an embodiment, the material of the dielectric layer 108 is an oxide, nitride, polymer or the like. The dielectric layer 108 electrically insulates the conductive elements 106 from each other. In an embodiment, the dielectric layer 108 will have a k-value, or dielectric constant, sufficient to prevent cross-talk between individual elements by reducing the magnitude of the electric field created in the dielectric layer 108 by signals in the conductive elements 106.

In an embodiment, the mounting pads 110 and conductive elements 106 are formed from copper (Cu), but may be polysilicon, gold (Au), aluminum (Al), tantalum (Ta), tungsten (W), or any other suitable conductive material or compound. Mounting pad 110 or conductive elements 106 may be formed using photolithography and deposition processes such as plasma enhanced chemical vapor deposition (PECVD), physical vapor deposition (PVD), sputtering, or another deposition process.

The mounting pads 110 may be formed on the carrier wafer 102, and the initial dielectric layer 108 is formed over the mounting pads 110. The dielectric layer 108 may be etched by, for example, photolithography, to form one or more openings extending through the dielectric layer 108. The conductive elements 106 may be formed in the openings and over the top surface of the dielectric layer 108. The conductive elements 106 comprise vias extending through the dielectric layer 108 and traces disposed over the dielectric layer 108 to provide routing of electrical signals.

Figure 2:
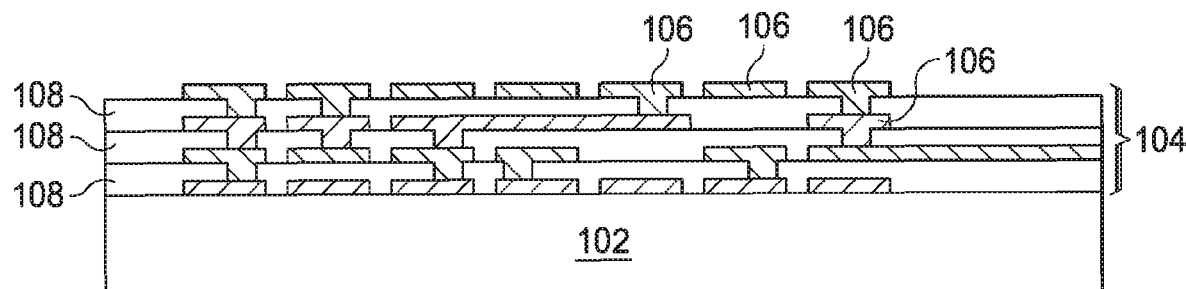

FIG. 2 is a cross-sectional view illustrating formation of additional layers of the first RDL 104 according to an embodiment. Additional dielectric layers 108 are formed over the initial dielectric layers 108, and may have one or more conductive elements 106 disposed therein. The conductive elements 106 may form one or more landing pads on the uppermost dielectric layer 108.

Figure 3:
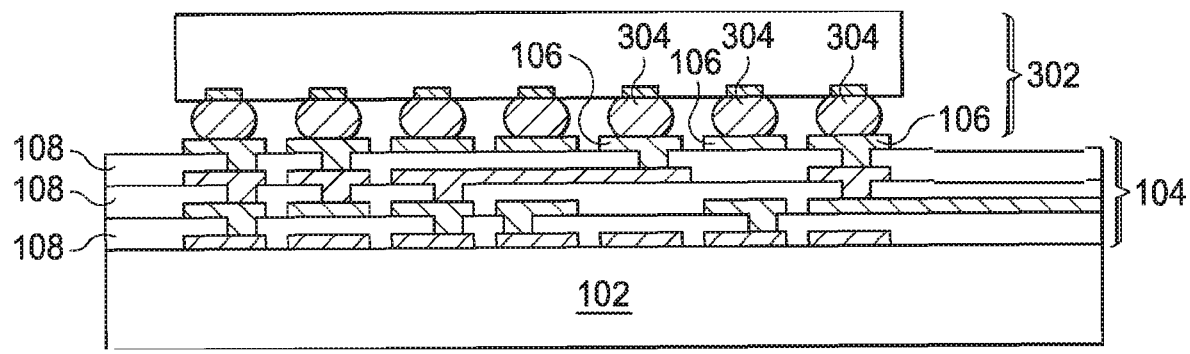
Figure 7:
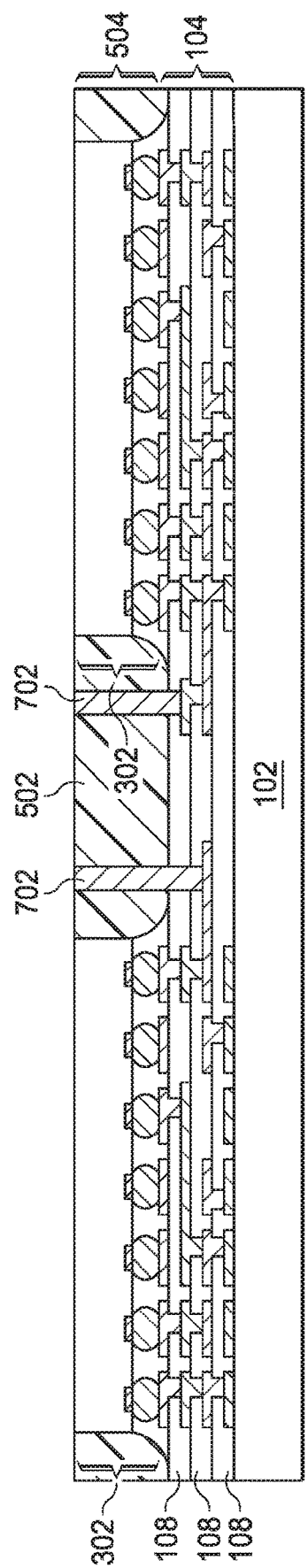
Figure 8:
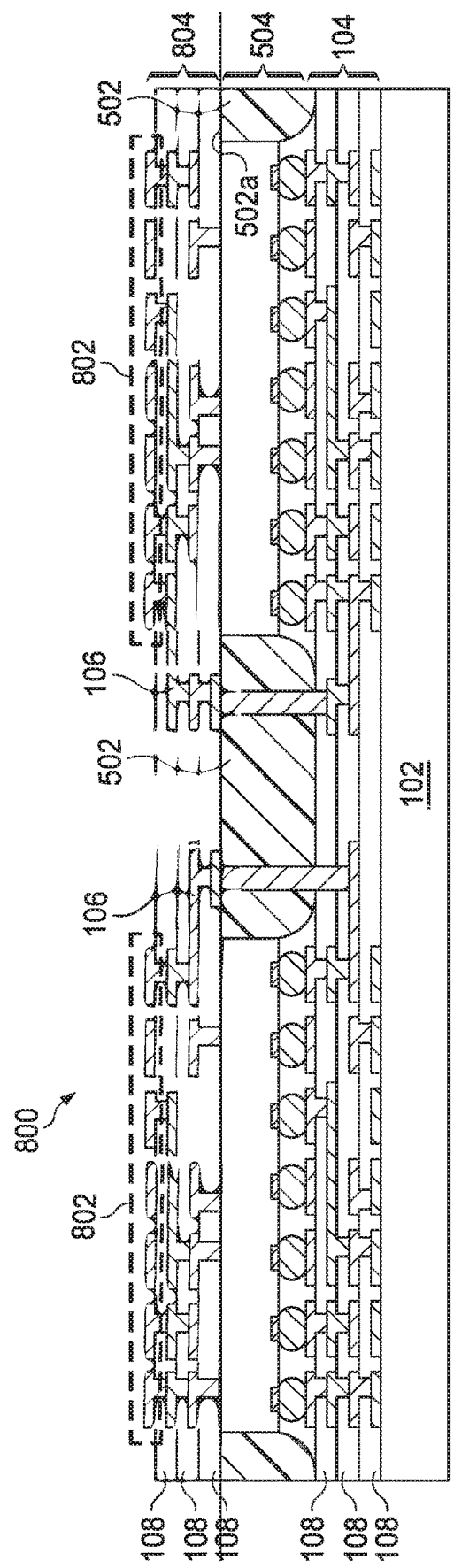
Figure 9:
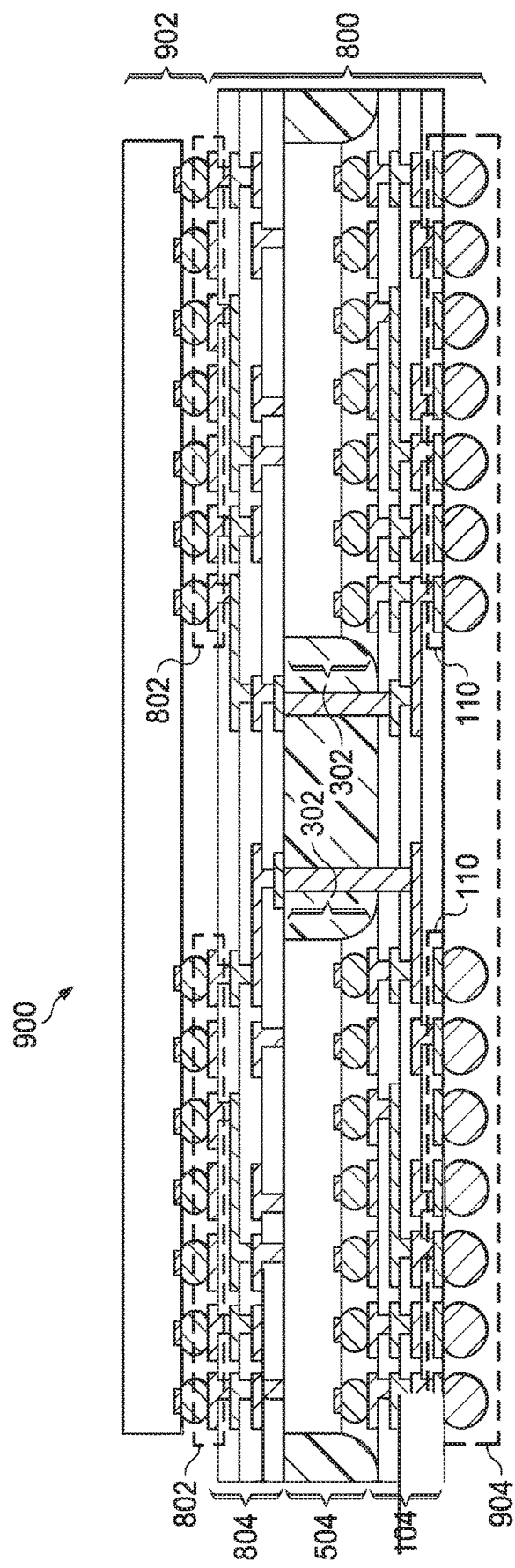

FIG. 3 is a cross-sectional view illustrating mounting of an interposer die 302 on the first RDL 104. The interposer die 302 may be a die, chip, integrated circuit, board, assembly, package or the like, and may be mounted on the conductive elements 106 or landing pads disposed at the top of the RDL 104. The interposer die 302 may be attached to the conductive elements 106 by way of an array of interconnects 304 such as a ball grid array, a land grid array, or the like. In an embodiment, multiple interposer dies 302 may be mounted on the first RDL 104 as shown in FIGS. 7-9. Additionally, the interposer dies 302 may be a combination of component types. For example, one interposer die 302 may be an active device such as a processor, while a second interposer die 302 is a substrate with one or more passive devices such as resistors, capacitors, amplifiers, or the like. In another example, an interposer die 302 may be a microelectrical mechanical (MEMs) device, a power management circuit, an RF circuit such as a transceiver or signal processing circuit, an image sensor or image sensor controller, or the like. One or more interposer dies may also be, in an embodiment, a filler or dummy die, such as a silicon or glass/silicon oxide structure. For example, where a package has three active interposer dies 302, but is sized to accept 4 or more interposer dies 302, a filler die may be used in the interposer (504, FIG. 5) to provide structural rigidity or standardize an interposer layout or fabrication process.

In an embodiment, the interposer die 302 has a height of about 500 µm or greater at application to the first RDL 104. In an embodiment, the interconnects 304 have a pitch of about 40 µm or and a height after attaching the interposer die 302 of about 150 µm or less.

Figure 4:
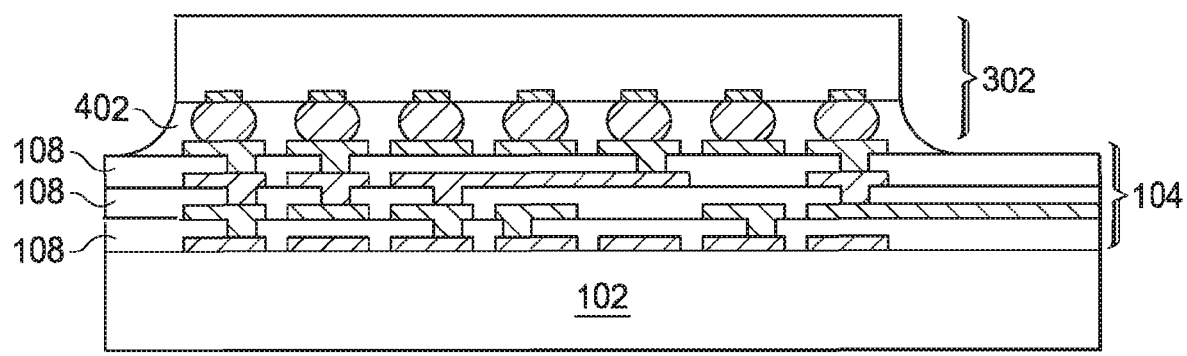

FIG. 4 is a cross-sectional view illustrating application of an underfill 402 according to an embodiment. The underfill 402 is applied, in an embodiment, as a liquid or gel, and is injected between the interposer die 302 and the first RDL 104 to fill any spaces and provide support to the interposer die 302. The underfill 402 provides control of warping of the interposer die 302 and permits a smaller interconnect 304 pitch.

Figure 5:
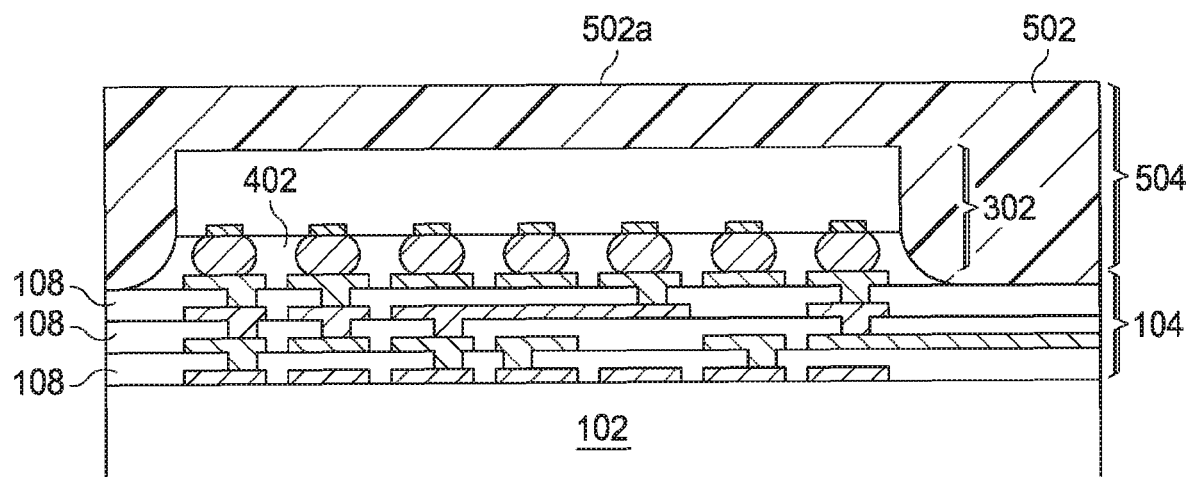

FIG. 5 is a cross-sectional view illustrating application of a molding compound 502 and formation of the interposer 504 according to an embodiment. The interposer 504 comprises the interposer die 302, the molding compound 502, and the underfill 402. In an embodiment, the molding compound 502 may be a nonconductive material, such as an epoxy, a resin, a moldable polymer, or the like. The molding compound 502 may be formed to provide a surface on which to form subsequent layers and to support the interposer die 302. In an embodiment, the molding compound 502 may be shaped or molded using for example, a mold (not shown) which may have a border or other feature for retaining molding compound 502 when applied. In an embodiment, the mold may be used to pressure mold the molding compound 502 to force the molding compound 502 into openings and recesses, and may avoid air pockets or the like in the molding compound 502. The molding compound 502 may be cured through a chemical reaction, such as in an epoxy or resin. In another embodiment the molding compound 502 may be an ultraviolet (UV) cured polymer.

Figure 6:
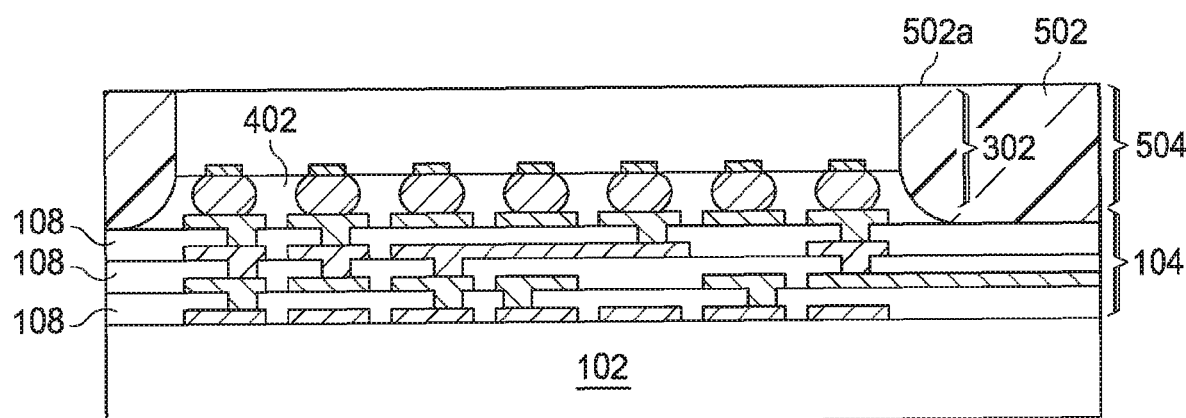

FIG. 6 is a cross-sectional view illustrating reducing the interposer 504 according to an embodiment. The top surface of the molding compound 502 may be reduced down by grinding or the like to reduce the thickness of the interposer 504. In an embodiment, the top surface of the interposer die 302 may be ground down during the reducing of the interposer 504. The reduction of the interposer 504 may, in an embodiment, reduce the thickness of the interposer 504 to about 500 µm or less.

FIG. 7 is a cross-sectional view illustrating formation of interposer vias 702 according to an embodiment. The interposer vias 702 may extend from the top surface of the molding compound 502 to at least the top surface of the first RDL 104 to contact a conductive element 106 on the first RDL 104. In an embodiment, the interposer vias 702 may extend into the first RDL 104 to contact a conductive element 106 in a layer of the first RDL 104 below the uppermost layer of the first RDL 104. The interposer vias 702, in an embodiment, may be disposed in the interposer die 302 or in another structure in the interposer 504. In an embodiment, the interposer vias 702 may be reduced along with the molding compound 502 and interposer die 302 to result in a substantially planar surface of the interposer 504.

In an embodiment, the interposer vias 702 are formed after application of the molding compound 502. For example, the molding compound 502 may be etched, milled or otherwise processed to form an opening extending through the molding compound to at least the first RDL 104. The interposer vias 702 are then formed in the openings by plating, deposition, or the like. In another embodiment, the interposer vias 702 are formed prior to, or during, application of the molding compound 502. In such an embodiment, the interposer vias 702 may be pre-formed and placed on a conductive element 106 or formed on a conductive element 106 prior to application of the molding compound 502. The molding compound 502 is then formed around the placed interposer vias 702. For example, the interposer vias 702 may be created by milling, molding, or the like and then bonded to a conductive element 106 using ultrasonic bonding, solder, or the like. In another embodiment, the interposer vias 702 may be formed using a wirebonder to bond a wire on the conductive elements 106 prior to cutting the interposer via 702 to length. In another example, the interposer via 702 may be formed using a mask and deposition technique.

FIG. 8 is a cross-sectional view illustrating an intermediate structure 800 and formation of a second RDL 804 according to an embodiment. The second RDL 804 comprises one or more dielectric layers 108 with conductive elements 106 disposed therein. The second RDL 804 may be formed using a process similar to those described above with respect to forming the first RDL as shown in FIGS. 1-2. One or more lands 802 may be disposed at, or on, the top surface of the second RDL 804 and may be configured to accept one or more components mounted thereon.

FIG. 9 is a cross-sectional view illustrating a package 900 with a secondary component 902 over the intermediate structure 800 according to an embodiment. The carrier wafer 102 may be debonded or removed and interconnects 904 such as a ball grid array, a land grid array, or the like may be applied to the mounting pads 110. One or more secondary components 902 may be mounted on the lands on the second RDL 804. The secondary components 902 may be a dies, chip, integrated circuits, boards, assemblies, packages or other components, or a combination of components types.

In an embodiment, the first RDL 104 is in electrical contact with the second RDL 804 by way of at least one interposer via 702, and the secondary component 902 is in electrical contact with another secondary component 902, an interposer die 302 or the interconnects 904 by way of at least the second RDL 804, the interposer vias 702 or the first RDL 104. In an embodiment, one of the interposer dies 302 is in electrical contact with a second of the interposer dies 302 by way of the first RDL or the second RDL, and in an embodiment, one of the interposer dies 302 is in contact with at least one of the mounting pads 110.

Figure 10:
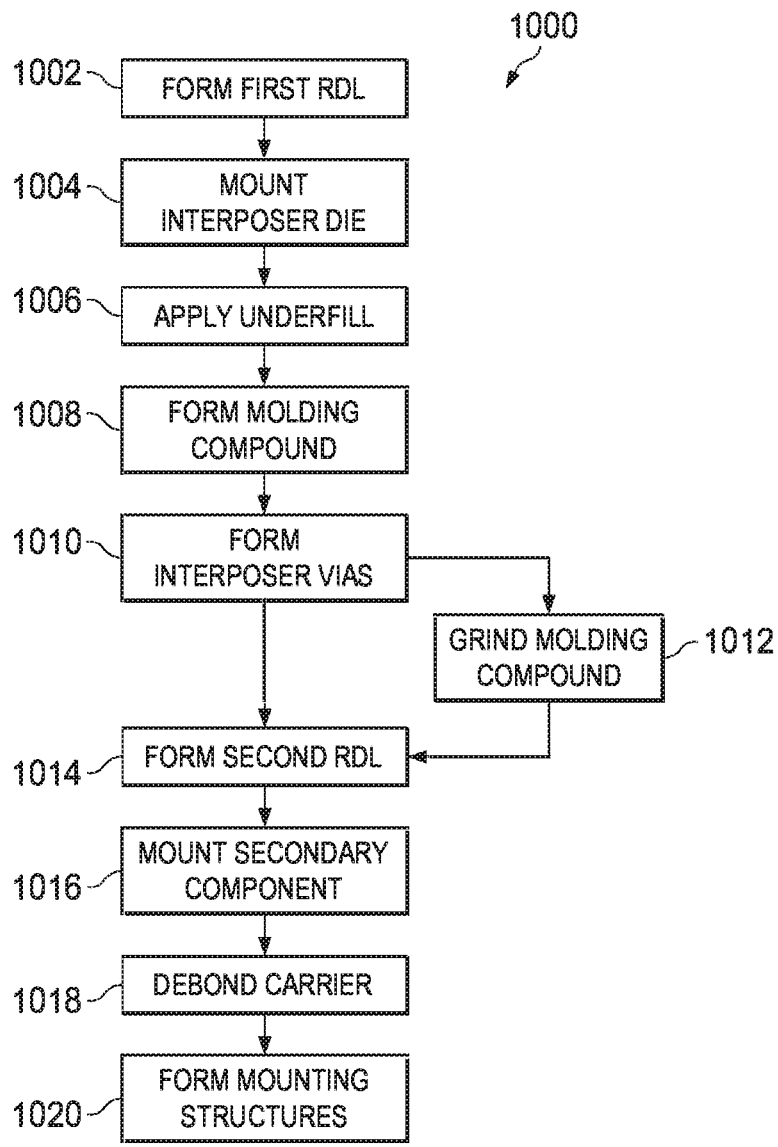
FIG. 10 is a flow diagram illustrating a method of forming a WLCPS intermediate structure according to an embodiment.

FIG. 10 is a flow diagram illustrating a method 1000 of forming a WLCPS intermediate structure according to an embodiment. A first RDL is formed on a carrier wafer in block 1002. The first RDL has one or more conductive elements disposed in one or more dielectric layers. One or more interposer dies are mounted on the first RDL and in contact with at least one of the conductive elements in block 1004. An underfill is applied between the first RDL and the interposer dies in block 1006, and a molding compound is formed over the interposer dies and at least a portion of the first RDL in block 1008. One or more interposer vias may be formed in the molding substrate in block 1010 as part of forming the molding compound or after application of the molding compound. The molding compound is optionally reduced in block 1012, and the reduction may be grinding, such as by a CMP or the like. A second RDL is formed in block 1014, with the second RDL disposed over the interposer dies and the molding compound. The second RDL may be in contact with the interposer dies and/or molding compound, and may have one or more conductive elements disposed in one or more dielectric layers. One or more lands are disposed on the second RDL or in the uppermost layer of the second RDL. A secondary component is mounted, in block 1016, on the lands of the second RDL. The carrier wafer is debonded in block 1018 and one or more mounting structures formed on the mounding pads of the first RDL in block 1020. The package, including the secondary component and the interposer, may be singulated where necessary, and subsequently mounted to another device such as a PCB, carrier package, or the like, by way of the mounting structures or may be packaged, encapsulated, or otherwise processed.

Thus, according to an embodiment, a method of forming a device comprises forming a first RDL on a carrier, the first RDL having one or more mounting pads disposed on a first side of the first RDL and mounting one or more interposer dies on a second side of the first RDL, a first side of the one or more interposer dies adjacent to the first RDL. A second RDL is formed over a second side of the one or more interposer dies, the second RDL having a first side adjacent to the interposer dies and a second side opposite the first side. One or more lands are disposed on the second side of the second RDL, with at least one of the one or more lands in electrical contact with at least one of the one or more interposer dies or at least one of the one or more mounting pads. A molding compound is formed around the one or more interposer dies and over a portion of the first RDL prior to the forming the second RDL, wherein forming the second RDL comprises forming the second RDL over at least a portion of the molding compound. One or more interposer vias are formed extending through the molding compound. The method further comprises reducing the molding compound and forming an underfill between the one or more interposer dies and the first RDL. A secondary component is mounted on the lands disposed on the second side of the second RDL and one or more mounting structures formed on the mounting pads of the first RDL.

A device according to an embodiment comprises a first RDL having one or more conductive elements disposed in one or more dielectric layers one or more mounting pads disposed on a first side of the RDL and an interposer disposed on a second side of the first RDL. The interposer comprises one or more interposer dies disposed on a second side of the first RDL, a first side of the one or more interposer dies adjacent to the first RDL and a molding compound disposed around the one or more interposer dies and over a portion of the first RDL. A second RDL is disposed over a second side of the one or more interposer dies and one or more lands are disposed on the second side of the second RDL. At least one of the one or more lands is in electrical contact with at least one of the one or more interposer dies or at least one of the one or more mounting pads. One or more interposer vias are disposed in the molding compound and extend through the molding compound. The second side of the one or more interposer dies is substantially planar with a first side of the molding compound, and the second RDL is in contact with the second side of the one or more interposer dies and the molding compound. The first RDL is in electrical contact with the second RDL. A secondary component is disposed on the lands disposed on the second side of the second RDL. The secondary component is in electrical contact with at least one of the one or more interposer dies. The interposer may comprise at least two interposer dies, with a first one of the at least two interposer dies in electrical contact with a second of the at least two interposer dies. The first of the at least two interposer dies is an active device.

One general aspect of embodiments disclosed herein includes a device including: a first redistribution layer (RDL) having one or more conductive elements disposed in one or more dielectric layers; one or more mounting pads disposed on a first side of the RDL; an interposer disposed on a second side of the first RDL, the interposer including: one or more interposer dies disposed on a second side of the first RDL, a first side of the one or more interposer dies adjacent to the first RDL; and a molding compound disposed around the one or more interposer dies and over a portion of the first RDL; a second RDL disposed over a second side of the one or more interposer dies; and one or more lands disposed on the second side of the second RDL, at least one of the one or more lands in electrical contact with at least one of the one or more interposer dies or at least one of the one or more mounting pads.

Another general aspect of embodiments disclosed herein includes a device, including: a first redistribution layer (RDL), the first RDL having one or more mounting pads disposed on a first side of the first RDL; one or more interposer dies mounted on a second side of the first RDL, a first side of the one or more interposer dies adjacent to the first RDL; a second RDL over a second side of the one or more interposer dies, the second RDL having a first side adjacent to the interposer dies and a second side opposite the first side, one or more lands disposed on the second side of the second RDL, at least one of the one or more lands in electrical contact with at least one of the one or more interposer dies or at least one of the one or more mounting pads; and a secondary component on the lands disposed on the second side of the second RDL.

Yet another general aspect of embodiments disclosed herein includes a device, including: a first redistribution layer (RDL) having one or more conductive elements disposed in one or more dielectric layers and one or more mounting pads disposed on a first side of the first RDL; one or more interposer dies mounted on a second side of the first RDL opposite the first side of the first RDL, respective first sides of the one or more interposer dies being adjacent to the first RDL and in electrical contact with at least one of the one or more conductive elements disposed in the first RDL; and a molding compound around the one or more interposer dies and over a portion of the first RDL; a through via extending through the molding compound; where the molding compound, the one or more interposer dies and the through via are each co-planar at a respective topmost surface; a second RDL over a second side of the one or more interposer dies; and one or more lands on the second side of the second RDL, at least one of the one or more lands in electrical contact with at least one of the one or more interposer dies or at least one of the one or more mounting pads.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, and composition of matter, means, methods or steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   a first redistribution layer (RDL) having a plurality of levels of conductive elements disposed in respective ones of a plurality of stacked dielectric layers;
   one or more mounting pads disposed on a first side of the RDL;
   an interposer disposed on a second side of the first RDL, the interposer comprising:
     one or more interposer dies disposed on a second side of the first RDL, a first side of the one or more interposer dies adjacent to the first RDL, respective ones of the one or more interposer dies being electrically connected to the first RDL through respective solder balls; and
     a molding compound disposed around the one or more interposer dies and over a portion of the first RDL;
   a second RDL disposed over a second side of the one or more interposer dies;
   one or more lands disposed on the second side of the second RDL, at least one of the one or more lands in electrical contact with at least one of the one or more interposer dies or at least one of the one or more mounting pads; and
   a first interposer via extending through the molding compound and landing on a first level of the RDL, and a second interposer via extending through the molding compound and landing on a second level of the RDL, the second level being different from the first level.

2. The device of claim 1, wherein the second side of the one or more interposer dies is substantially planar with a first side of the molding compound, and wherein the second RDL is in contact with the second side of the one or more interposer dies and the molding compound.

3. The device of claim 1, wherein the first RDL is in electrical contact with the second RDL.

4. The device of claim 1, further comprising a secondary component disposed on the lands disposed on the second side of the second RDL.

5. The device of claim 4, wherein the secondary component is in electrical contact with at least one of the one or more interposer dies.

6. The device of claim 5, wherein at least one of the one or more interposer dies is an active device.

7. A device, comprising:
   a first multi-level redistribution layer (RDL), the first RDL having one or more mounting pads disposed at a topmost level on a first side of the first RDL;
   one or more interposer dies mounted on a second side of the first RDL, a first side of the one or more interposer dies adjacent to the first RDL;
   a second RDL over a second side of the one or more interposer dies, the second RDL having a first side adjacent to the interposer dies and a second side opposite the first side, one or more lands disposed on the second side of the second RDL, at least one of the one or more lands in electrical contact with at least one of the one or more interposer dies or at least one of the one or more mounting pads;
   a first interposer via extending from a first land on the second RDL to a first mounting pad on the topmost level of the first RDL;
   a second interpose via extending from a second land on the second RDL to a second mounting pad on a second level of the first RDL, the second level being below the topmost level; and
   a secondary component on the lands disposed on the second side of the second RDL.

8. The device of claim 7, further comprising a molding compound encapsulating the one or more interposer dies and a portion of the first RDL, wherein the second RDL is over at least a portion of the molding compound.

9. The device of claim 8, further comprising an underfill between the one or more interposer dies and the first RDL.

10. The device of claim 7, further comprising one or more mounting structures on the mounting pads of the first RDL.

11. A device, comprising:
a first redistribution layer (RDL) having conductive elements disposed in respective ones of multiple dielectric layers forming multiple stacked levels of conductive elements, the RDL further having and one or more mounting pads disposed in at least two levels of the multiple stacked levels;
one or more interposer dies mounted on a second side of the first RDL opposite the first side of the first RDL, respective first sides of the one or more interposer dies being adjacent to the first RDL and in electrical contact with at least one of the one or more conductive elements disposed in the first RDL; and
a molding compound around the one or more interposer dies and over a portion of the first RDL;
a through via extending through the molding compound including a first through via physically contacting a first mounting pad in a topmost level of the multiple stacked levels of the first RDL and a second through via physically contacting a second mounting pad in an intermediate level of the multiple stacked levels of the first RDL;
wherein the molding compound, the one or more interposer dies and the through via are each co-planar at a respective topmost surface;
a second RDL over a second side of the one or more interposer dies; and
one or more lands on the second side of the second RDL, at least one of the one or more lands in electrical contact with at least one of the one or more interposer dies or at least one of the one or more mounting pads.

12. The device of claim 11, further comprising one or more interposer vias in the molding compound and extending through the molding compound.

13. The device of claim 11, wherein respective second sides of the one or more interposer dies are substantially planar with a first side of the molding compound, and wherein the second RDL is in contact with respective second sides of the one or more interposer dies and the molding compound.

14. The device of claim 11, wherein the first RDL is in electrical contact with the second RDL.

15. The device of claim 14, further comprising a secondary component mounted on the lands on the second side of the second RDL.

16. The device of claim 15, wherein the secondary component is in electrical contact with at least one of the one or more interposer dies.

17. The device of claim 15, wherein the secondary component is a component selected from the group consisting of dies, chips, integrated circuits, boards, assemblies, packages, and a combination thereof.

18. The device of claim 15, further comprising at least two interposer dies, and wherein a first one of the at least two interposer dies is in electrical contact with a second one of the at least two interposer dies.

* * * * *